United States Patent
Weber et al.

(10) Patent No.: US 12,365,581 B2
(45) Date of Patent: Jul. 22, 2025

(54) MICROMECHANICAL COMPONENT FOR A SENSOR OR MICROPHONE DEVICE

(71) Applicant: Robert Bosch GmbH, Stuttgart (DE)

(72) Inventors: Heribert Weber, Nuertingen (DE); Andreas Scheurle, Leonberg (DE); Joachim Fritz, Tuebingen (DE); Peter Schmollngruber, Aidlingen (DE); Sophielouise Mach, Reutlingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 595 days.

(21) Appl. No.: 17/315,975

(22) Filed: May 10, 2021

(65) Prior Publication Data
US 2021/0354978 A1    Nov. 18, 2021

(30) Foreign Application Priority Data
May 18, 2020    (DE) .......................... 102020206242.0

(51) Int. Cl.
B81B 3/00    (2006.01)
(52) U.S. Cl.
CPC .... *B81B 3/0056* (2013.01); *B81B 2201/0257* (2013.01); *B81B 2201/0264* (2013.01); *B81B 2203/0127* (2013.01); *B81B 2203/019* (2013.01); *B81B 2203/0307* (2013.01); *B81B 2203/0315* (2013.01)

(58) Field of Classification Search
CPC .......... B81B 3/0056; B81B 2201/0257; B81B 2201/0264; B81B 7/0016; B81B 2203/0109; B81B 2203/019; B81B 2203/0315; B81B 2203/0307; B81B 2203/0127
USPC ....................................................... 257/416
See application file for complete search history.

(56) References Cited

U.S. PATENT DOCUMENTS

| | | | |
|---|---|---|---|
| 2014/0060169 A1* | 3/2014 | McNeil | G01L 9/12 73/718 |
| 2014/0137670 A1* | 5/2014 | Hata | G01L 1/148 73/862.621 |
| 2017/0108391 A1* | 4/2017 | Ikehashi | G01L 9/12 |

(Continued)

OTHER PUBLICATIONS

Merriam-Webster OnLine defintion of "attached." No Date.*
Merriam-Webster OnLine defintion of "and/or." No Date.*

*Primary Examiner* — Nathan W Ha
(74) *Attorney, Agent, or Firm* — NORTON ROSE FULBRIGHT US LLP

(57) ABSTRACT

A micromechanical component for a sensor or microphone device, including a substrate, a frame structure, which is situated on the substrate surface and/or at least one intermediate layer, and a diaphragm, which spans an inner volume, which is at least partially framed by the frame structure. The micromechanical component includes a bending beam structure, which is situated in the inner volume and includes at least one anchoring area, which is attached to the frame structure, to the substrate surface and/or to the at least one intermediate layer, and at least one self-supporting area, which is connected via at least one coupling structure to the diaphragm inner side of the diaphragm in such a way that the at least one self-supporting area is bendable by way of a warping of the diaphragm.

10 Claims, 7 Drawing Sheets

(56) References Cited

U.S. PATENT DOCUMENTS

| | | | | |
|---|---|---|---|---|
| 2018/0275004 A1* | 9/2018 | Hayashi | ............... | G01L 9/0047 |
| 2018/0282148 A1* | 10/2018 | Hayashi | ............... | G01L 9/0055 |
| 2018/0335358 A1* | 11/2018 | Zheng | ............... | B81B 7/0064 |
| 2022/0041435 A1* | 2/2022 | Reinmuth | ............ | G01L 9/0073 |
| 2022/0155168 A1* | 5/2022 | Reinmuth | ............ | B81B 3/0059 |

* cited by examiner

MICROMECHANICAL COMPONENT FOR A SENSOR OR MICROPHONE DEVICE

CROSS REFERENCE

The present application claims the benefit under 35 U.S.C. § 119 of German Patent Application No. DE 102020206242.0 filed on May 18, 2020, which is expressly incorporated herein by reference in its entirety.

FIELD

The present invention relates to a micromechanical component for a sensor or microphone device. The present invention furthermore relates to a manufacturing method for a micromechanical component for a sensor or microphone device.

BACKGROUND INFORMATION

FIG. 1 shows a schematic representation of a conventional pressure sensor device which is internal related art to the applicant.

The pressure sensor device schematically represented in FIG. 1 includes a substrate 10 including a substrate surface 10a, a frame structure 14, which is situated on at least one intermediate layer 12a and 12b at least partially covering substrate surface 10a, and a diaphragm 16. Diaphragm 16 spans an inner volume 18, which is at least partially framed by frame structure 14, in such a way that a diaphragm inner side 16a of diaphragm 16 abuts inner volume 18. In addition, diaphragm 16 is warpable by a pressure difference between an internal pressure $p_1$ present at its diaphragm inner side 16a and an external pressure $p_2$ present at a diaphragm outer side 16b directed away from 102325410.1 diaphragm inner side 16a. As is schematically shown in FIG. 1, a pressure force F acting on the diaphragm due to the pressure difference between internal pressure $p_1$ and external pressure $p_2$ may deform the diaphragm so drastically that cracks 20 occur at diaphragm 16, in particular in a clamping area 16c of diaphragm 16.

By way of example, the conventional pressure sensor device of FIG. 1 also includes a measuring electrode 22, which is suspended at diaphragm inner side 16a of diaphragm 16 via at least one suspension structure 24. A measuring counter electrode 26 is attached between measuring electrode 22 and substrate surface 10a on the at least one intermediate layer 12a and 12b. The conventional pressure sensor device of FIG. 1 also includes at least one fixed reference electrode 28 at a predefined distance from at least one reference counter electrode 30 attached on the at least one intermediate layer 12a and 12b, the at least one reference electrode 28 and the at least one reference counter electrode 30 being situated at least partially circumferentially around measuring electrode 22 and measuring counter electrode 26.

SUMMARY

The present invention provides a micromechanical component for a sensor or microphone device, and a manufacturing method for a micromechanical component for a sensor or microphone device.

The present invention provides micromechanical components in which cracking at their diaphragm is reliably prevented due to the formation of the bending beam structure according to the present invention. The bending beam structure according to the present invention of such a micromechanical component may be designed in such a way that even in an overload case, when a comparatively high pressure acts on the diaphragm, cracking is even reliably prevented in a clamping area of the particular diaphragm. The conventional risk of a failure of the micromechanical component, or of the sensor or microphone device designed therewith, due to cracks at its diaphragm is thus eliminated.

In one advantageous specific embodiment of the micromechanical component, the at least one coupling structure is formed completely of at least one electrically conductive material. In this case, the same material used for forming the diaphragm, for example silicon, may generally be used for forming the at least one coupling structure. A formation of the at least one coupling structure is thus comparatively easy and only requires relatively little effort.

As an alternative, the at least one coupling structure may at least partially be formed of at least one electrically insulating material. In this case, an electric potential present at the at least one self-supporting area of the respective bending beam structure may deviate from an electric potential present at the adjoining diaphragm.

As an advantageous refinement of the micromechanical component, the at least one self-supporting area of the bending beam structure may span at least one counter electrode situated on the substrate surface and/or the at least one intermediate layer, the at least one counter electrode being electrically insulated from the at least one self-supporting area of the bending beam structure, and a measuring signal being tappable between the at least one self-supporting area of the bending beam structure and the at least one counter electrode. As is explained in greater detail below, in this case the measuring signal may be used as a "warning signal" with respect to a comparatively high pressure force acting on the diaphragm.

As an alternative or in addition, it is also possible for at least one protruding stop structure to be formed at a surface of the at least one self-supporting area of the bending beam structure which is directed away from the diaphragm. With the aid of the at least one stop structure, a maximum warping of the diaphragm may be mechanically limited.

In one further advantageous specific embodiment of the micromechanical component, the bending beam structure and at least one reference electrode, attached at the frame structure, at the substrate surface and/or at the at least one intermediate layer, and/or at least one measuring electrode are formed of a first semiconductor and/or metal layer, and/or the diaphragm, the at least one coupling structure and/or at least one suspension structure via which the at least one measuring electrode is suspended at the diaphragm inner side is/are formed of a second semiconductor and/or metal layer. The micromechanical component described here may thus be manufactured comparatively easily and cost-effectively, despite it being equipped with at least one reference electrode and/or at least one measuring electrode.

Furthermore, an execution of a corresponding manufacturing method for a micromechanical component for a sensor or microphone device also provides the above-described advantages, it being possible for the manufacturing method to be refined according to the above-explained specific embodiments of the micromechanical component.

BRIEF DESCRIPTION OF THE DRAWINGS

Further features and advantages of the present invention are described hereafter based on the figures.

DETAILED DESCRIPTION OF EXAMPLE EMBODIMENTS

Figure 2:
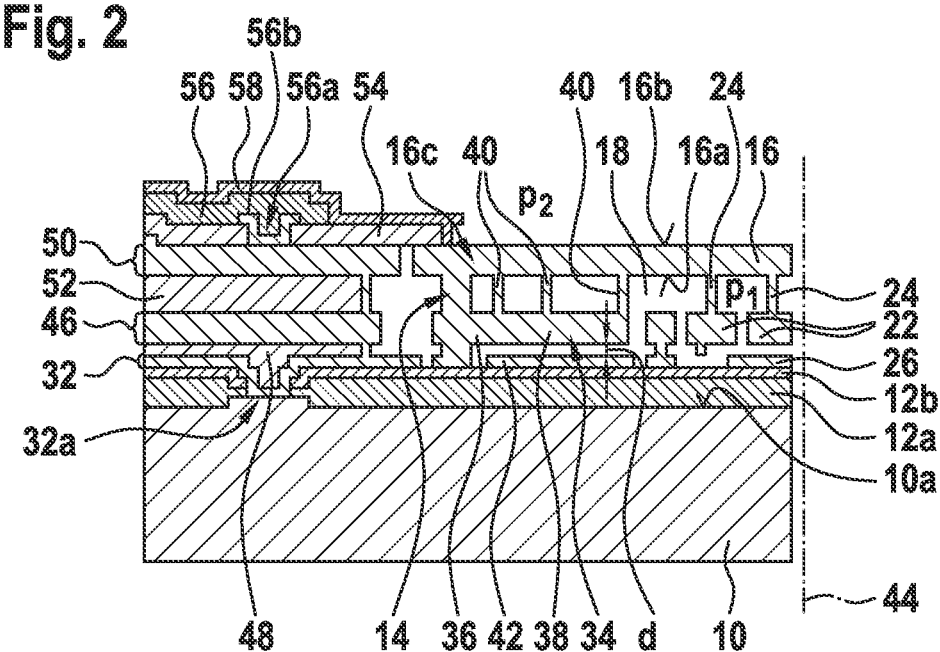
FIG. 2 shows a schematic partial representation of a first specific embodiment of the micromechanical component, in accordance with the present invention.

FIG. 2 shows a schematic partial representation of a first specific embodiment of the micromechanical component in accordance with the present invention.

The micromechanical component partially shown schematically in FIG. 2 has a substrate 10 including a substrate surface 10a which, for example, is a semiconductor substrate, in particular, a silicon substrate. Substrate surface 10a is at least partially covered by at least one intermediate layer 12a and 12b. The at least one intermediate layer 12a and 12b may, for example, be at least one insulating layer 12a and 12b, such as, in particular, a silicon dioxide layer 12a and/or a silicon-rich silicon nitride layer 12b. Optionally, a strip conductor layer 32 may be deposited on substrate surface 10a and/or the at least one intermediate layer/insulating layer 12a and 12b, an electrical contact 32a being formable/formed in each case, for example, by way of a direct contact between substrate surface 10a and strip conductor layer 32. Strip conductor layer 32 may, for example, be a silicon layer.

The micromechanical component also has a frame structure 14, which is situated on substrate surface 10a and/or the at least one intermediate layer 12a and 12b. A diaphragm 16 spans an inner volume 18, which is at least partially framed by frame structure 14, in such a way that a diaphragm inner side 16a of diaphragm 16 abuts inner volume 18. In addition, inner volume 18 is hermetically sealed in such a way that diaphragm 16 is warpable/warped by a pressure difference between an internal pressure $p_1$ present at its diaphragm inner side 16a and an external pressure $p_2$ present at a diaphragm outer side 16b directed away from diaphragm inner side 16a. FIG. 2, however, shows the micromechanical component when a pressure is the same between internal pressure $p_1$ and external pressure $p_2$.

In addition, the micromechanical component of FIG. 2 includes a bending beam structure 34, situated in inner volume 18, including at least one anchoring area 36, which is attached at frame structure 14, at substrate surface 10a and/or at the at least one intermediate layer 12a and 12b, and at least one self-supporting area 38. The at least one self-supporting area 38 is connected in each case via at least one coupling structure 40 in such a way to diaphragm inner side 16a of diaphragm 16 that the at least one self-supporting area 38 is bendable/bent by a warping of diaphragm 16. As is illustrated based on the following specific embodiment, bending beam structure 34 acts as a design measure for reducing a mechanical stress occurring in diaphragm 16 with a pressure difference between internal pressure $p_1$ and external pressure $p_2$, in particular, in a clamping area 16c of diaphragm 16.

The micromechanical component of FIG. 2 also includes, as an optional refinement, a counter electrode 42, which is situated on substrate surface 10a and/or the at least one intermediate layer 12a and 12b and which spans the at least one self-supporting area 38 of bending beam structure 34. Counter electrode 42 is electrically insulated from the at least one self-supporting area 38 of bending beam structure 34. In addition, a measuring signal, such as for example a voltage signal, is tappable between the at least one self-supporting area 38 of bending beam structure 34 and counter electrode 42. During a significant warping of diaphragm 16, a distance d between the at least one self-supporting area 38 of bending beam structure 34 and counter electrode 42 changes, which is apparent based on a change in the measuring signal, such as for example the tapped voltage. With the aid of the arrangement of the at least one coupling structure 40, via which the at least one self-supporting area 38 of bending beam structure 34 is connected to diaphragm inner side 16a of diaphragm 16, it is possible to establish at which degree of a warping of diaphragm 16 a significant change in distance d, and thus a considerable change in the measuring signal, occurs. By evaluating the measuring signal, it may thus be established whether a critical warping of diaphragm 16 occurs. If necessary, a corresponding warning signal may then be output to a user of the micromechanical component and/or to a control electronics operating the mechanical component.

As is additionally shown in FIG. 2, the micromechanical component also includes at least one measuring electrode 22, which is suspended at diaphragm inner side 16a of diaphragm 16 via at least one suspension structure 24. In particular, a respective measuring counter electrode 26 may be attached on substrate surface 10a and/or the at least one intermediate layer 12a and 12b, between the at least one measuring electrode 22 and substrate 10. By way of an interaction of the at least one measuring electrode 22 and the at least one measuring counter electrode 26, the pressure difference between internal pressure $p_1$ and external pressure $p_2$, for example a sound wave impinging on diaphragm outer side 16b, may be detected. The micromechanical component described here may thus advantageously be used for a sensor or microphone device.

A minimum distance between the at least one coupling structure 40 and clamping area 16c of diaphragm 16 is preferably smaller than a minimum distance between the at least one suspension structure 24 and clamping area 16c. A "central suspension" at diaphragm 16 is preferred in the process for the at least one measuring electrode 22, while bending beam structure 34 is situated as close as possible to clamping area 16c of diaphragm 16 or directly at clamping area 16c of diaphragm 16. In particular in the overload case, high bending forces occur at clamping area 16c of diaphragm 16, which is why it is advantageous to absorb a deformation force/deformation energy acting, in this case, on clamping area 16c with the aid of the at least one coupling structure 40 and bending beam structure 34. The geometric dimensions and the shape of bending beam structure 34, as well as the distance between the at least one coupling structure 40 and clamping area 16c of diaphragm 16, determine the force which counteracts the deformation force/deformation energy on diaphragm 16 at the site of the at least one coupling structure 40. In addition, a favorable sensitivity may be ensured with the aid of a "central suspension" of the at least one measuring electrode 22 at diaphragm 16 during the detection of the pressure difference between internal pressure $p_1$ and external pressure $p_2$, or during the detection of a sound wave impinging on diaphragm outer side 16b.

Optionally, the micromechanical component of FIG. 2 may be designed to be mirror-symmetrical with respect to a plane of symmetry 44. As an alternative, however, a reference electrode 28, including an assigned reference counter electrode 30, as it is shown, for example, in FIG. 1, may also be situated on a side of measuring electrode 22 which is directed away from bending beam structure 34.

With the aid of the manufacturing method described hereafter, the micromechanical component partially shown in FIG. 2 may be easily manufactured even in mass production, while adhering to a favorable reproduction accuracy.

To execute the manufacturing method, a first semiconductor and/or metal layer 46 is deposited on substrate surface 10a, the at least one intermediate layer 12a and 12b, strip conductor layer 32 and/or at least one first sacrificial layer 48. First semiconductor and/or metal layer 46 may be a silicon layer, for example. The at least one first sacrificial layer 48 may, in particular, be a silicon dioxide layer. In addition, a second semiconductor and/or metal layer 50 is deposited on first semiconductor and/or metal layer 46 and/or at least one second sacrificial layer 52. Second semiconductor and/or metal layer 50 may also be a silicon layer/polysilicon layer. The at least one second sacrificial layer 52 may be a silicon dioxide layer, for example.

Frame structure 14 is preferably formed of at least a portion of strip conductor layer 32, of at least a portion of first semiconductor and/or metal layer 46, and of at least a portion of second semiconductor and/or metal layer 50 in such a way that the frame structure 14, formed on substrate surface 10a and/or the at least one intermediate layer 12a and 12b, at least partially frames the (later) inner volume 18. Inner volume 18 is spanned by diaphragm 16 in such a way that diaphragm inner side 16a of diaphragm 16 abuts inner volume 18, diaphragm 16 being formed of second semiconductor and/or metal layer 50. Bending beam structure 34 is formed of/structured out of first semiconductor and/or metal layer 46 in such a way that bending beam structure 34 is situated in inner volume 18, and designed with the at least one anchoring area 36, which is attached at frame structure 14, substrate surface 10a and/or to the at least one intermediate layer 12a and 12b, and with the at least one self-supporting area 38. The at least one coupling structure 40, by which the at least one self-supporting area 38 is connected to diaphragm inner side 16a of diaphragm 16 in such a way that the at least one self-supporting area 38 is bendable by a warping of diaphragm 16, may also be formed of second semiconductor and/or metal layer 50.

Figure 1:
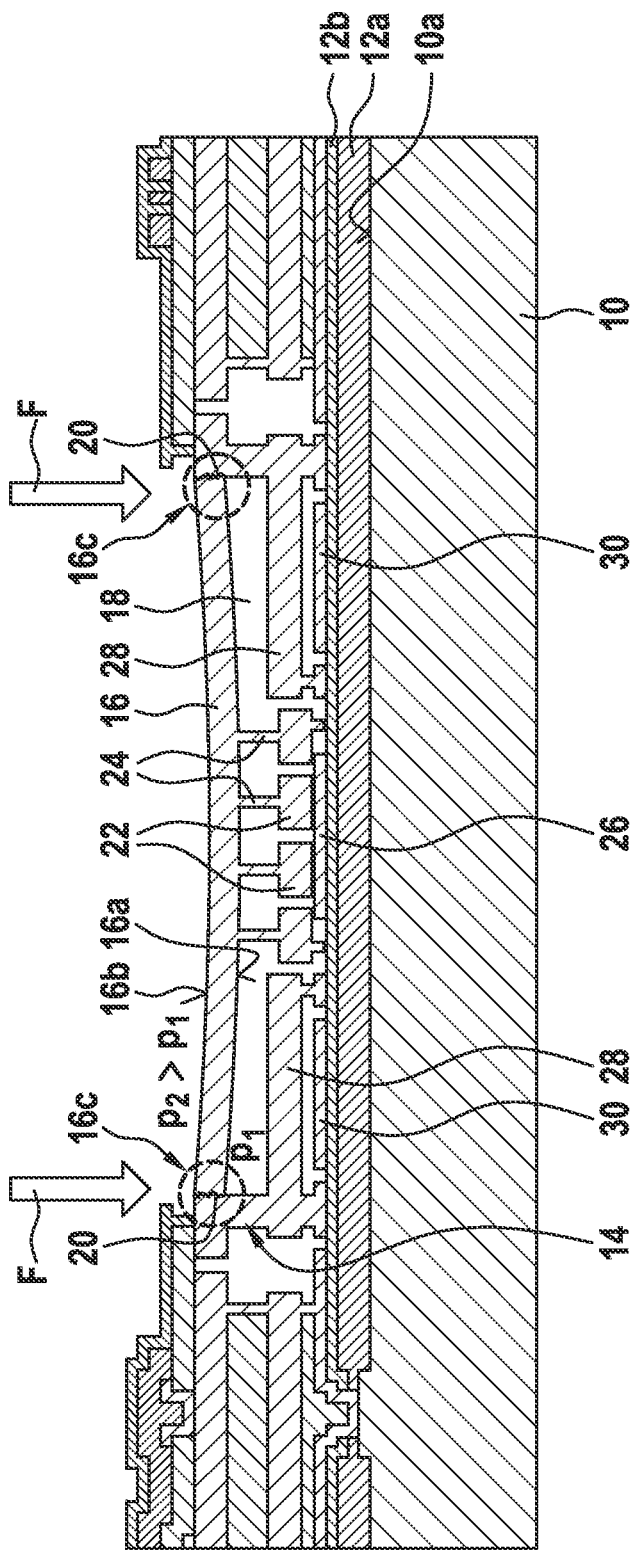
FIG. 1 shows a schematic representation of a conventional pressure sensor device.

As is shown in FIG. 1 and FIG. 2, in addition to bending beam structure 34, the at least one reference electrode 28, which is attached at frame structure 14, substrate surface 10a and/or to the at least one intermediate layer 12a and 12b, and/or the at least one measuring electrode 22 may also be formed of/structured out of first semiconductor and/or metal layer 46. In addition to diaphragm 16 and, possibly, the at least one coupling structure 40, the at least one suspension structure 24, via which the at least one measuring electrode 22 is suspended at diaphragm inner side 16a, may also be formed of second semiconductor and/or metal layer 50. In addition, counter electrode 42, the at least one measuring counter electrode 26 and/or the at least one reference counter electrode 30 may be formed of/structured out of strip conductor layer 32.

After an at least partial removal/etching of sacrificial layers 48 and 52, inner volume 18 is hermetically sealed (preferably at a desired internal pressure $p_1$), for example by depositing an insulating layer 54 onto at least one partial outer surface of second semiconductor and/or metal layer 50 which frames at least one etching opening. The at least one partial outer surface shall, preferably, be understood to mean a surface of second semiconductor and/or metal layer 50 which directly abuts the particular etching opening. In this way, it is ensurable that diaphragm 16 is warpable/warped by a pressure difference between internal pressure $p_1$ present at its diaphragm inner side 16a and external pressure $p_2$ (instantaneously) present at a diaphragm outer side 16b. Optionally, at least one electrical contact 56a may also be formed with the aid of a metallization 56, such as for example aluminum copper, and/or an optional contact metallization 56b, such as for example $TiSi_2/Ti$, and/or an optional diffusion barrier, such as for example TiN. As a further optional method step, a passivation 58, such as for example silicon nitride ($Si_3N_4$), may also be deposited on metallization 56 and insulating layer 54.

Figure 3A:
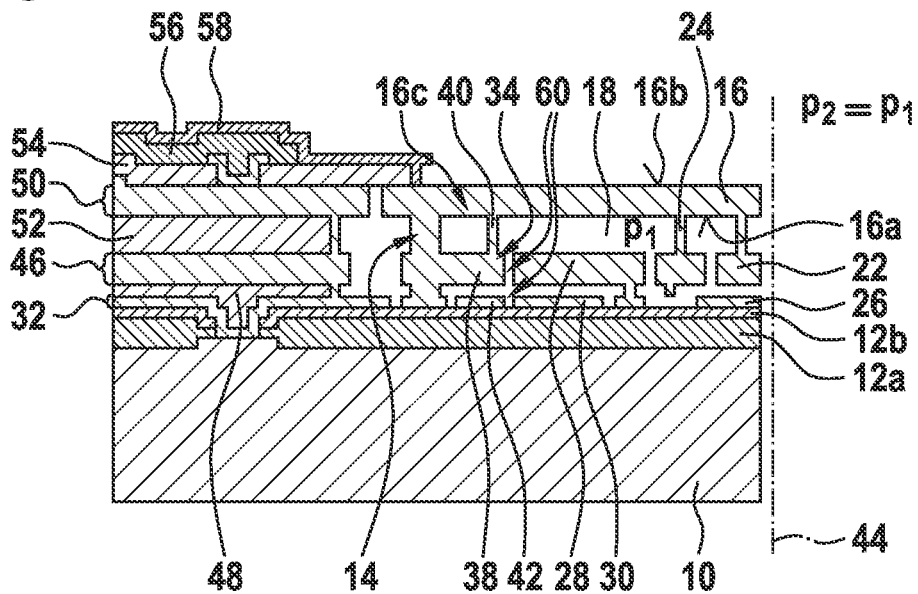
FIGS. 3a and 3b show schematic partial representations of a second specific embodiment of the micromechanical component, in accordance with the present invention.
Figure 3B:
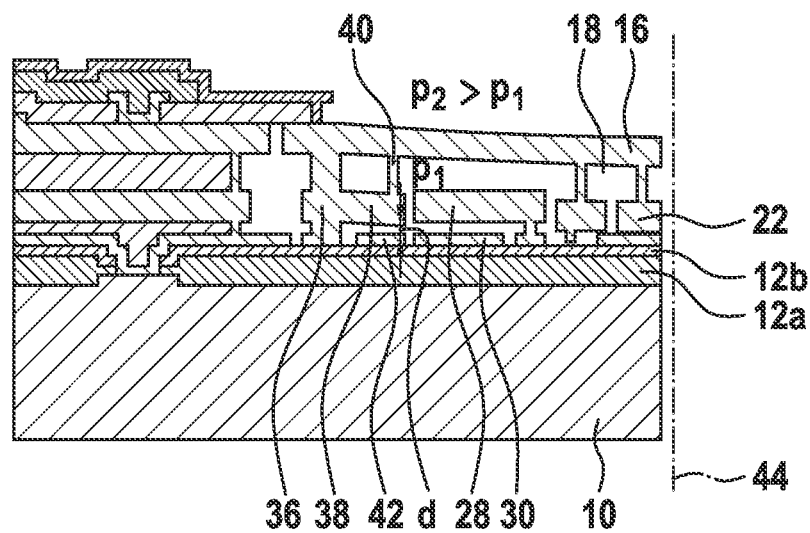

FIGS. 3a and 3b show schematic partial representations of a second specific embodiment of the micromechanical component.

The micromechanical component at least partially shown schematically in FIGS. 3a and 3b also includes at least one reference electrode 28 attached at frame structure 14, substrate surface 10a and/or to the at least one intermediate layer 12a and 12b, as a supplement to the above-described specific embodiment. The at least one reference electrode 28 spans a respective assigned reference counter electrode 30. With the aid of the at least one reference electrode 28 and its at least one reference counter electrode 30, it is possible to carry out reference capacitance measurements to be able to "filter out," or correct, distance changes/measuring signal changes, which are attributable to a bending of substrate 10, between the at least one measuring electrode 22 and its at least one measuring counter electrode 26. As is apparent in FIGS. 3a and 3b, the at least one reference electrode 28 may be formed of/structured out of first semiconductor and/or metal layer 46, and its at least one reference counter electrode 30 may be formed of/structured out of strip conductor layer 32. In particular, bending beam structure 34, its counter electrode 42, an adjoining reference electrode 28, and an adjoining reference counter electrode 30 may be formed of a "conventional" reference electrode 28 of FIG. 1 and its assigned reference counter electrode 30, with the aid of a structuring of a respective continuous intermediate gap 60.

In the representation of FIG. 3a, external pressure $p_2$ is equal to internal pressure $p_1$ in inner volume 18. In contrast, external pressure $p_2$ is higher than internal pressure $p_1$ in the representation of FIG. 3b. It is apparent that, in this case, the warping of diaphragm 16 triggers a bending of the at least one self-supporting area 38 of bending beam structure 34, by which a change in distance d occurs between the at least one self-supporting area 38 of bending beam structure 34 and the assigned counter electrode 42, and by which energy is absorbed, or a counter force is generated on diaphragm 16, which is why diaphragm 16 is warped less drastically compared to the related art. A mechanical stress occurring in warped diaphragm 16 is thus reduced, in particular, in clamping area 16c of diaphragm 16. In this way, the development of cracks in diaphragm 16 may be reliably counteracted with the aid of bending beam structure 34. As a result, no cracking in diaphragm 16 is thus to be feared, even with a comparatively thin design of diaphragm 16. The risk of a failure of the micromechanical component due to cracks in its diaphragm 16 is thus considerably reduced compared to the related art.

It is also pointed out here that the counter force, or the amount of energy absorbed by bending beam structure 34, may be established by a length of the at least one self-supporting area 38 of bending beam structure 34 which is oriented in parallel to substrate surface 10a, a width of the at least one self-supporting area 38 of bending beam structure 34 which is oriented in parallel to substrate surface 10a, a height of the at least one self-supporting area 38 of bending beam structure 34 which is oriented perpendicular to substrate surface 10a, and the shape of the at least one self-supporting area 38 of bending beam structure 34. With the aid of a position of the at least one coupling structure 40, it is also possible to "set" the counter force which the at least one self-supporting area 38 of bending beam structure 34 applies to the diaphragm 16 at the site of the at least one coupling structure 40. Via the geometric dimensions and the shape of the at least one self-supporting area 38 of bending beam structure 34, as well as via the distance between the at least one coupling structure 40 and clamping area 16c of diaphragm 16, the bending of diaphragm 16 (due to the present external pressure $p_2$) may deliberately be counteracted locally in a more or less drastic manner. The counter force, or the amount of energy absorbed by bending beam structure 34, may thus be flexibly set. Through the use of multiple coupling structures 40 per self-supporting area 38, it may additionally be achieved that during a pressure application of diaphragm outer side 16b the resulting diaphragm warping/diaphragm bending may be "modeled"/set in a better/more defined manner.

With respect to further properties and features of the micromechanical component of FIGS. 3a and 3b and their advantages, reference is made to the specific embodiment of FIG. 2.

Figure 4:
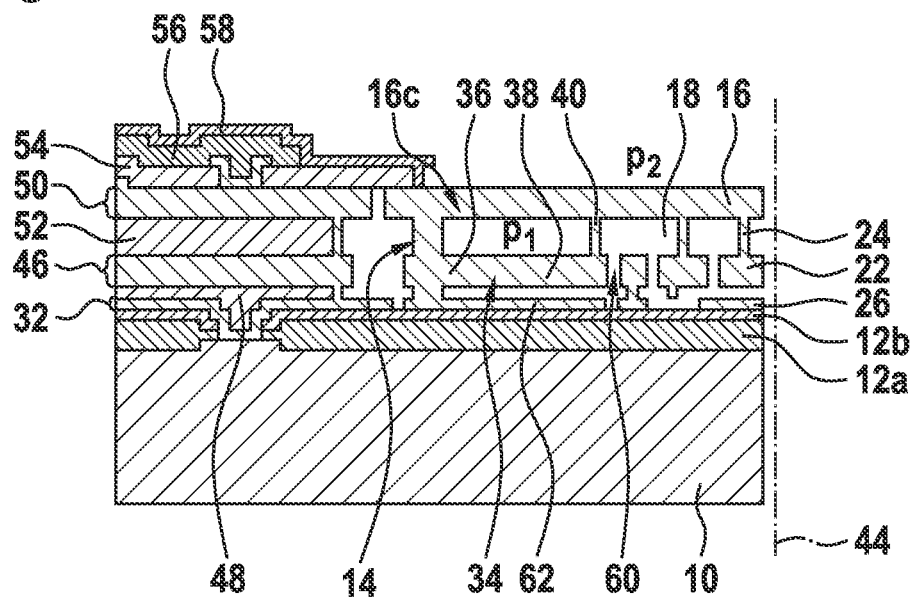
FIG. 4 shows a schematic partial representation of a third specific embodiment of the micromechanical component, in accordance with the present invention.

FIG. 4 shows a schematic partial representation of a third specific embodiment of the micromechanical component, in accordance with the present invention.

In the specific embodiment of FIG. 4, self-supporting area 38 of bending beam structure 34 extends across an electrically conductive structure 62, which is situated on substrate surface 10a and/or the at least one intermediate layer 12a and 12b and which has the same potential as self-supporting area 38 of bending beam structure 34 (and possible diaphragm 16). With the aid of an electrical connection of electrically conductive structure 62 to bending beam structure 34, variable reference and stray capacitances during a pressure application of diaphragm 16 may be avoided. By way of example, self-supporting area 38 extends away from the assigned anchoring area 36 of its bending beam structure 34, and away from clamping area 16c of diaphragm 16.

With respect to further properties and features of the micromechanical component of FIG. 4 and their advantages, reference is made to the above-described specific embodiment.

Figure 5:
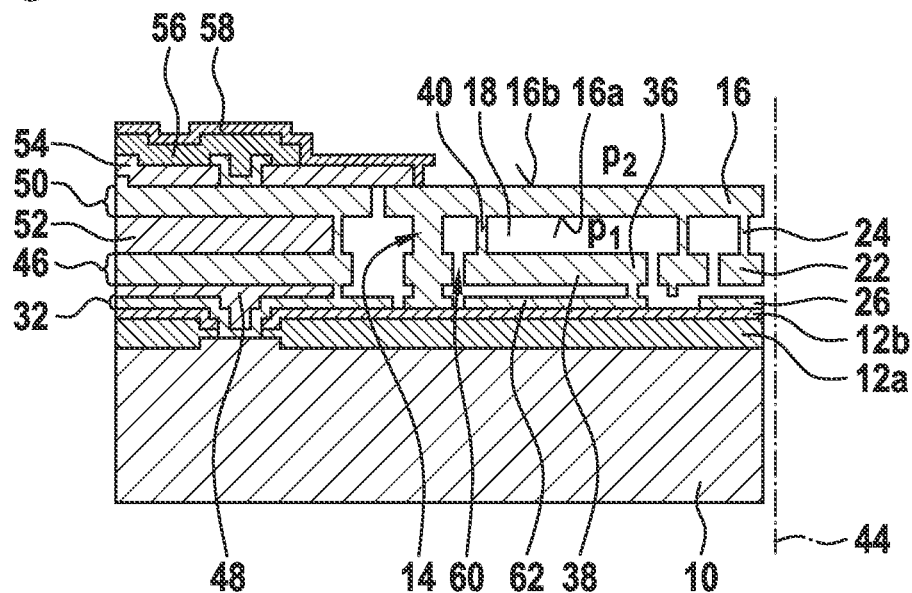
FIG. 5 shows a schematic partial representation of a fourth specific embodiment of the micromechanical component, in accordance with the present invention.

FIG. 5 shows a schematic partial representation of a fourth specific embodiment of the micromechanical component.

In the micromechanical component of FIG. 5, self-supporting area 38 of its bending beam structure 34 extends away from the assigned anchoring area 36, toward clamping area 16c of the diaphragm. A mechanical force coupling/energy coupling into bending beam structure 34 via its coupling structure 40 thus takes place close to clamping area 16c of diaphragm 16.

With respect to further properties and features of the micromechanical component of FIG. 5 and their advantages, reference is made to the above-described specific embodiment.

Figure 6:
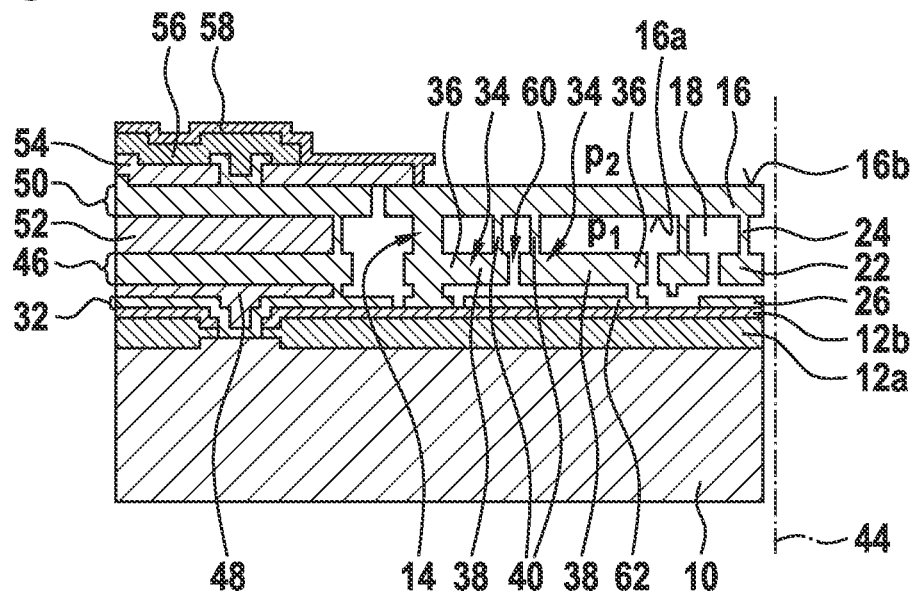
FIG. 6 shows a schematic partial representation of a fifth specific embodiment of the micromechanical component, in accordance with the present invention.

FIG. 6 shows a schematic partial representation of a fifth specific embodiment of the micromechanical component, in accordance with the present invention.

In the micromechanical component of FIG. 6, its bending beam structure 34 includes two anchoring areas 36, each including a self-supporting area 38, which is connected to diaphragm inner side 16a via at least one respective coupling structure 40. It is apparent that such a design of bending beam structure 34 is creatable with the aid of a continuous intermediate gap 60 through the "conventional" reference electrode 28 of FIG. 1. With such a bending beam structure 34, there is the option of exerting a respective counter force on diaphragm inner side 16a of diaphragm 16 at at least two different positions of diaphragm 16. In addition, it is possible, via a configuration of the two self-supporting areas 38, in particular their (possibly different) lengths, their (possibly different) widths, their (possibly different) heights, and their (possibly different) shapes, to influence the respective counter force in order to establish a bending of diaphragm 16 during a pressure application of diaphragm outer side 16b corresponding to a desired setpoint bending/setpoint deformation.

With respect to further properties and features of the micromechanical component of FIG. 6 and their advantages, reference is made to the above-described specific embodiment.

Figure 7:
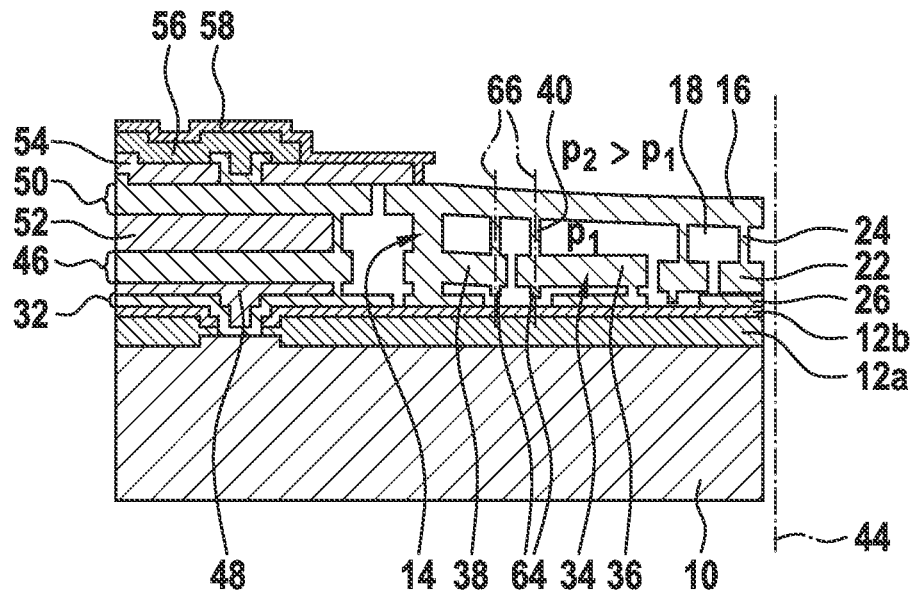
FIG. 7 shows a schematic partial representation of a sixth specific embodiment of the micromechanical component, in accordance with the present invention.

FIG. 7 shows a schematic partial representation of a sixth specific embodiment of the micromechanical component, in accordance with the present invention.

As a refinement of the above-described specific embodiment, the micromechanical component of FIG. 7 also includes at least one protruding stop structure 64 at a surface of the at least one self-supporting area 38 of bending beam structure 34 which is directed away from diaphragm 16. With the aid of the at least one stop structure 64, a maximum deflection of the at least one self-supporting area 38 in a direction toward substrate 10 may be limited. Accordingly, a maximum warping of diaphragm 16 may also be limited with the aid of the at least one stop structure 64. Preferably, a respective stop structure 64 and a respective coupling structure 40 extend along a shared axis 66. This may also be described in such a way that the at least one stop structure 64 is, in each case, situated within an "extended longitudinal axis" of the at least one coupling structure 40. This has the advantage that, upon a contact of the at least one stop structure 64 with a contact structure, substrate surface 10a and/or the at least one intermediate layer 12a and 12b, a force coupling into diaphragm 16 is passed directly into substrate surface 10 via the at least one coupling structure 40, the at least one self-supporting area 38, and the at least one stop structure 64. In the exemplary embodiment of FIG. 7, the at least one stop structure 64 contacts, by way of example, the at least one intermediate layer 12a and 12b during a drastic warping of diaphragm 16.

As an alternative, it is also possible, if desired, to design a "resilient stop" of the at least one self-supporting area 38 of bending beam structure 34 by positioning the at least one stop structure 64 offset from the at least one coupling structure 40, or outside the "extended longitudinal axis" of the at least one coupling structure 40.

With respect to further properties and features of the micromechanical component of FIG. 7 and their advantages, reference is made to the above-described specific embodiment.

Figure 8:
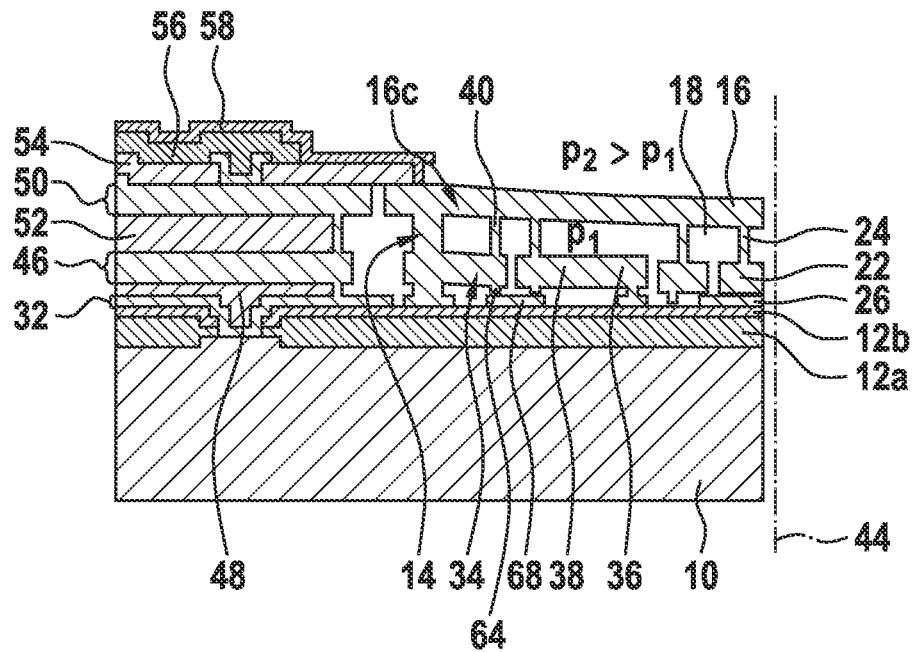
FIG. 8 shows a schematic partial representation of a seventh specific embodiment of the micromechanical component, in accordance with the present invention.

FIG. 8 shows a schematic partial representation of a seventh specific embodiment of the micromechanical component, in accordance with the present invention.

The micromechanical component of FIG. 8 also includes a contact structure 68, which contacts the at least one stop structure 64 during a drastic warping of diaphragm 16, as a supplement to the above-described specific embodiment. Contact structure 68 may be formed of/structured out of strip conductor layer 32, however is preferably designed to be electrically insulating with respect to its immediate surroundings. As an alternative, contact structure 68 may have the same potential as the at least one stop structure and/or the at least one self-supporting area 38 of bending beam structure 34.

With respect to further properties and features of the micromechanical component of FIG. 8 and their advantages, reference is made to the above-described specific embodiment.

Figure 9:
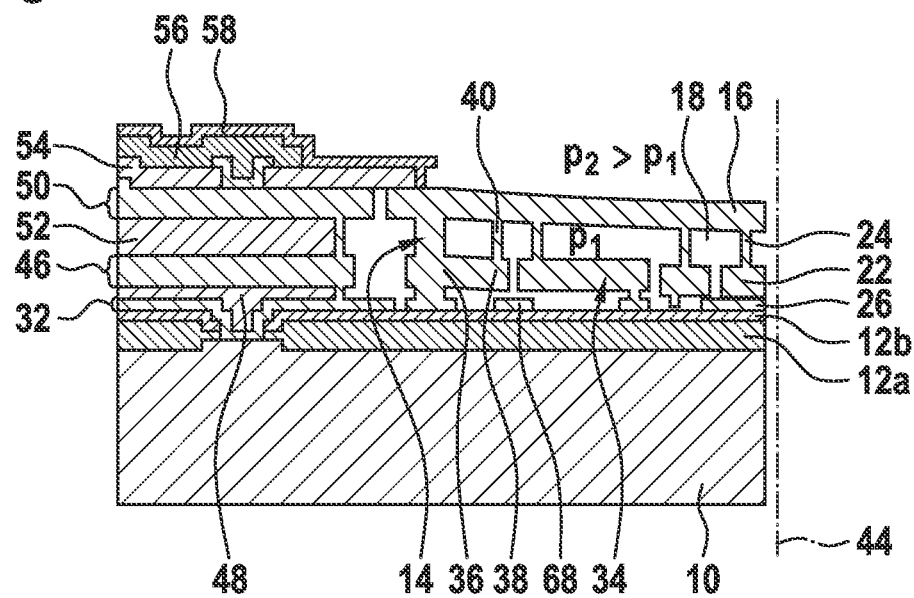
FIG. 9 shows a schematic partial representation of an eighth specific embodiment of the micromechanical component, in accordance with the present invention.

FIG. 9 shows a schematic partial representation of an eighth specific embodiment of the micromechanical component, in accordance with the present invention.

In the micromechanical component of FIG. 9, the creation of at least one protruding stop structure 64 at the at least one self-supporting area 38 of its bending beam structure 34 is dispensed with. However, the micromechanical component of FIG. 9 includes contact structure 68 which was already described above, against which at least one end of the at least one self-supporting area 38 of its bending beam structure 34 strikes during a drastic warping of diaphragm 16. A maximum warping of diaphragm 16 may also be established with the aid of contact structure 68 when the creation of at least one protruding stop structure 64 at the at least one self-supporting area 38 is dispensed with.

With respect to further properties and features of the micromechanical component of FIG. 9 and their advantages, reference is made to the above-described specific embodiment.

As an alternative, in a modification of the specific embodiments of FIGS. 8 and 9, electrically conductive structure 62 (instead of contact structure 68) may also be used for establishing a maximum warping of diaphragm 16.

Figure 10:
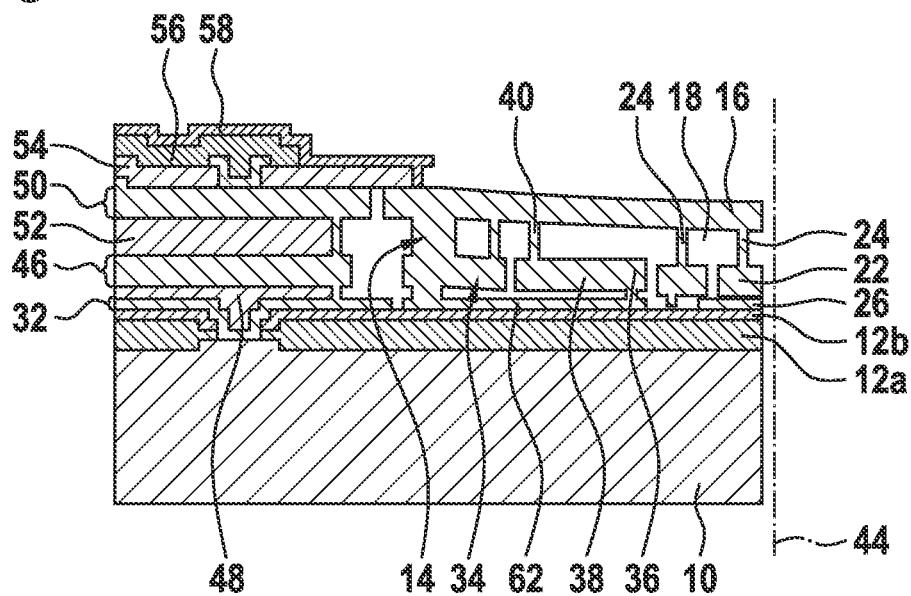
FIGS. 10 through 12 show schematic partial representations of a ninth, tenth and eleventh specific embodiment of the micromechanical component, in accordance with the present invention.
Figure 11:
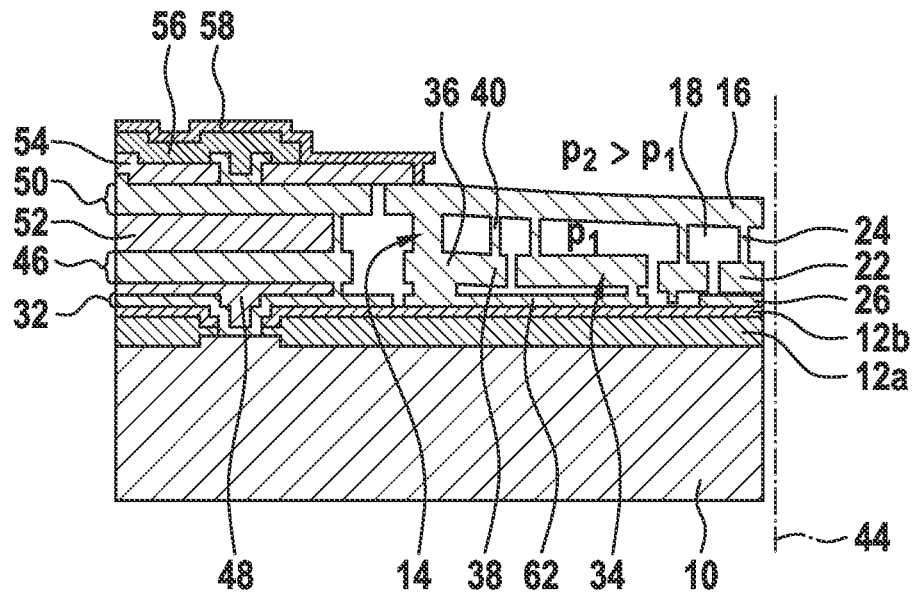
Figure 12:
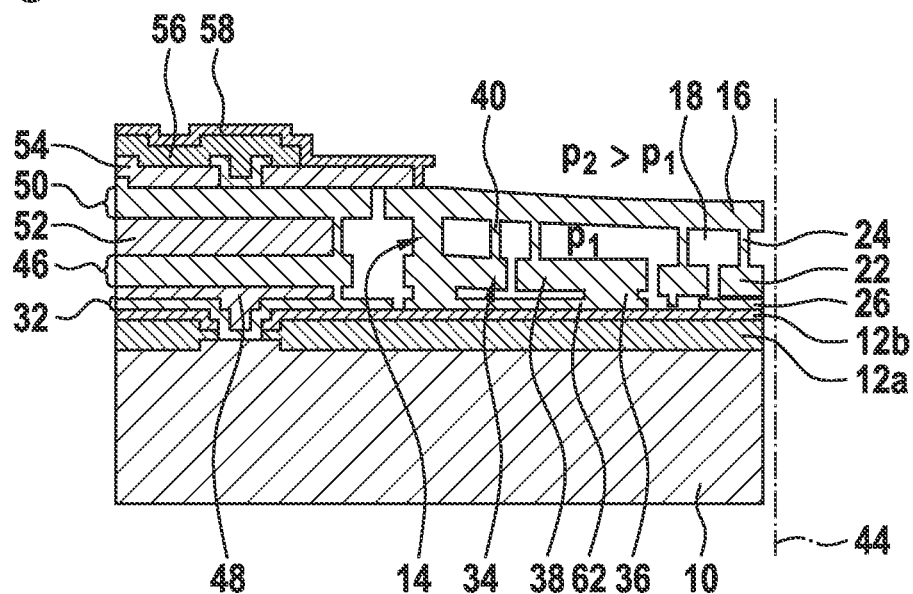

FIGS. 10 through 12 show schematic partial representations of a ninth, tenth and eleventh specific embodiment of the micromechanical component, in accordance with the present invention.

The micromechanical components of FIGS. 10 through 12 only differ from the specific embodiment of FIG. 6 in the at least partial increase in the geometric dimensions of an area of frame structure 14 extending from bending beam structure 34 to diaphragm 16, an area of frame structure 14 extending from bending beam structure 34 to strip conductor layer 32, and/or a further anchoring area 36 of bending beam structure 34. In this way, it is also possible to establish an amount of energy absorbed by bending beam structure 34, and influence may be exerted on the bending/deformation of diaphragm 16 when an external pressure $p_2$ is present.

With respect to further properties and features of the micromechanical components of FIGS. 10 through 12 and their advantages, reference is made to the above-described specific embodiments.

In all above-described micromechanical components, an amount of energy absorbed by its bending beam structure 34 may be established by a relatively free selection of the length of the at least one self-supporting area 38, the width of the at least one self-supporting area 38, the height of the at least one self-supporting area 38, the shape of the at least one self-supporting area 38, and a position of their at least one coupling structure 40. The at least one coupling structure 40 may be formed completely of at least one electrically conductive material, for example in that the at least one coupling structure 40 is completely formed of/structured out of second semiconductor and/or metal layer 50. As an alternative, the at least one coupling structure 40 may be at least partially formed of at least one electrically insulating material, such as, in particular, silicon-rich silicon nitride. When the at least one coupling structure 40 is at least partially created of silicon-rich silicon nitride, etching materials which are frequently used for etching sacrificial layers 48 and 52, such as for example HF or BOE, do not/hardly attack the silicon-rich silicon nitride.

All above-described micromechanical components may be manufactured with the aid of the explained manufacturing method, as a refinement possibly also at least one protruding stop structure 64 being created at a surface of the at least one self-supporting area 38 of bending beam structure 34 which is directed away from diaphragm 16. Frame structure 14, the at least one suspension structure 24 of the at least one measuring electrode 22 and/or anchoring area 36 may be designed to be at least partially electrically insulating. For example, silicon-rich silicon nitride may be used as electrically insulating material for forming frame structure 14 and/or anchoring area 36. In addition, semiconductor layers may be deliberately designed to be doped for improving the electrical conductivity.

What is claimed is:

1. A micromechanical component for a sensor or microphone device, comprising:
   a substrate including a substrate surface;
   a frame structure which is situated on at least one intermediate layer at least partially covering the substrate surface; and
   a diaphragm, which spans an inner volume, which is at least partially framed by the frame structure, in such a way that a diaphragm inner side of the diaphragm abuts the inner volume, the inner volume being hermetically sealed in such a way that the diaphragm is warpable by a pressure difference between an internal pressure present at the diaphragm inner side and an external pressure present at a diaphragm outer side of the diaphragm which is directed away from the diaphragm inner side; and
   a bending beam structure which is situated in the inner volume and includes at least one anchoring area, which is attached at the frame structure, to the substrate surface and/or to the at least one intermediate layer, and at least one self-supporting area, which is connected via at least one coupling structure to the diaphragm inner side of the diaphragm in such a way that the at least one self-supporting area is bendable by a warping of the diaphragm.

2. The micromechanical component as recited in claim 1, wherein the at least one coupling structure is formed completely of at least one electrically conductive material.

3. The micromechanical component as recited in claim 1, wherein the at least one coupling structure is at least partially formed of at least one electrically insulating material.

4. The micromechanical component as recited in claim 1, wherein the at least one self-supporting area of the bending beam structure spans at least one counter electrode situated on the at least one intermediate layer, the at least one counter electrode being electrically insulated from the at least one self-supporting area of the bending beam structure, and a measuring signal being tappable between the at least one self-supporting area of the bending beam structure and the at least one counter electrode.

5. The micromechanical component as recited in claim 1, wherein at least one protruding stop structure is provided at a surface of the at least one self-supporting area of the bending beam structure which is directed away from the diaphragm.

6. The micromechanical component as recited in claim 1, wherein: (i) the bending beam structure and at least one reference electrode attached at the frame structure to the at least one intermediate layer, and/or at least one measuring electrode is formed of a first semiconductor and/or metal layer, and/or (ii) the diaphragm, the at least one coupling structure and/or at least one suspension structure via which the at least one measuring electrode is suspended at the diaphragm inner side is formed of a second semiconductor and/or metal layer.

7. A manufacturing method for a micromechanical component for a sensor or microphone device, the method comprising the following steps:
    forming a frame structure on at least one intermediate layer at least partially covering a substrate surface;
    spanning an inner volume, which is at least partially framed by the frame structure, with a diaphragm in such a way that a diaphragm inner side of the diaphragm abuts the inner volume, the inner volume being hermetically sealed in such a way that the diaphragm is warpable by a pressure difference between an internal pressure present at the diaphragm inner side and an external pressure present at a diaphragm outer side of the diaphragm which is directed away from the diaphragm inner side;
    forming a bending beam structure in the inner volume, including at least one anchoring area, which is attached at the frame structure to the substrate surface and/or to the at least one intermediate layer, and including at least one self-supporting area, which is connected via at least one coupling structure to the diaphragm inner side of the diaphragm in such a way that the at least one self-supporting area is bendable by way of a warping of the diaphragm.

8. The manufacturing method as recited in claim 7, wherein at least one protruding stop structure is created at a surface of the at least one self-supporting area of the bending beam structure which is directed away from the diaphragm.

9. The manufacturing method as recited in claim 7, wherein at least the bending beam structure is formed of a first semiconductor and/or metal layer, which covers the substrate surface, the at least one intermediate layer, a strip conductor layer and/or at least one first sacrificial layer, and wherein the diaphragm and/or the at least one coupling structure is formed of a second semiconductor and/or metal layer covering the first semiconductor and/or metal layer and/or at least one second sacrificial layer.

10. The manufacturing method as recited in claim 9, wherein: (i) in addition to the bending beam structure, at least one reference electrode attached at the frame structure, to the at least one intermediate layer, and/or at least one measuring electrode, is formed of the first semiconductor and/or metal layer, and/or (ii) in addition to the diaphragm and/or the at least one coupling structure, at least one suspension structure via which the at least one measuring electrode is suspended at the diaphragm inner side is also formed of the second semiconductor and/or metal layer.

\* \* \* \* \*